United States Patent [19]

Gephart et al.

[11] 4,123,792
[45] Oct. 31, 1978

[54] CIRCUIT FOR MONITORING THE MECHANICAL POWER FROM AN INDUCTION MOTOR AND FOR DETECTING EXCESSIVE HEAT EXCHANGER ICING

[76] Inventors: Don A. Gephart, 5400 Banbury Dr., Worthington, Ohio 43085; Bruce H. Weber, 2370 Zollinger Rd., Columbus, Ohio 43221

[21] Appl. No.: 785,346

[22] Filed: Apr. 7, 1977

[51] Int. Cl.² ............................................. H02J 7/22
[52] U.S. Cl. ................................ 361/30; 324/103 R; 307/126
[58] Field of Search ............... 361/30, 79; 324/103 R; 307/126; 318/216

[56] References Cited

U.S. PATENT DOCUMENTS 2,992,365  7/1961  Brill .............................. 307/126 X
3,789,236  1/1974  Lacroix ........................... 307/126 X

*Primary Examiner*—Herman J. Hohauser
*Attorney, Agent, or Firm*—Frank H. Foster

[57] ABSTRACT

An electronic signal proportional to $I\cos\theta$ for an induction motor is substantially proportional to the mechanical power output of the motor. This signal is detected by rectifying a signal which is an analog of motor current in phase with the motor voltage and time averaging the rectified signal. Comparing the averaged signal to a reference level permits the interruption of motor current for an underload or an overload condition. The circuit permits detection of excessive ice formation on the outdoor heat exchanger of a heat pump system. The circuit is connected to the impeller drive motor which forces air across the heat exchanger and stops the motor and initiates the de-ice procedure when the ice blockage causes mechanical power delivered by the motor to deviate to a selected level.

10 Claims, 7 Drawing Figures

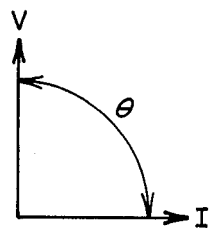
FIG. 2
NO LOAD
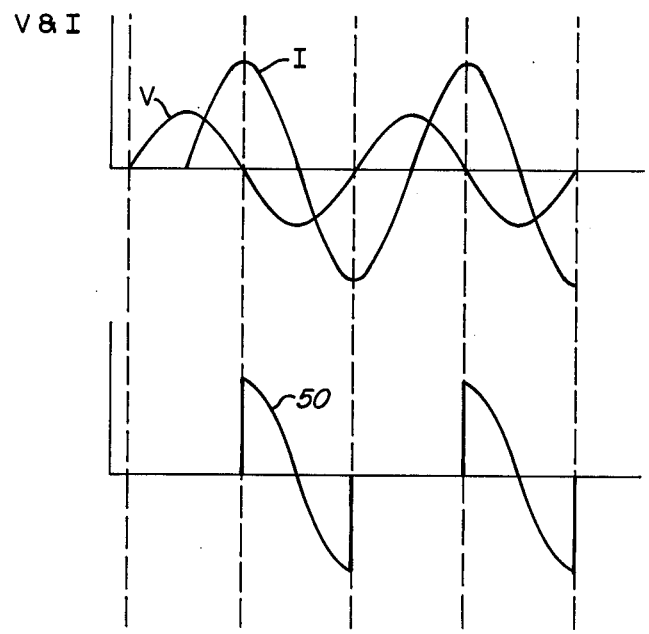
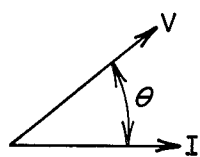
FIG. 3
LOADED
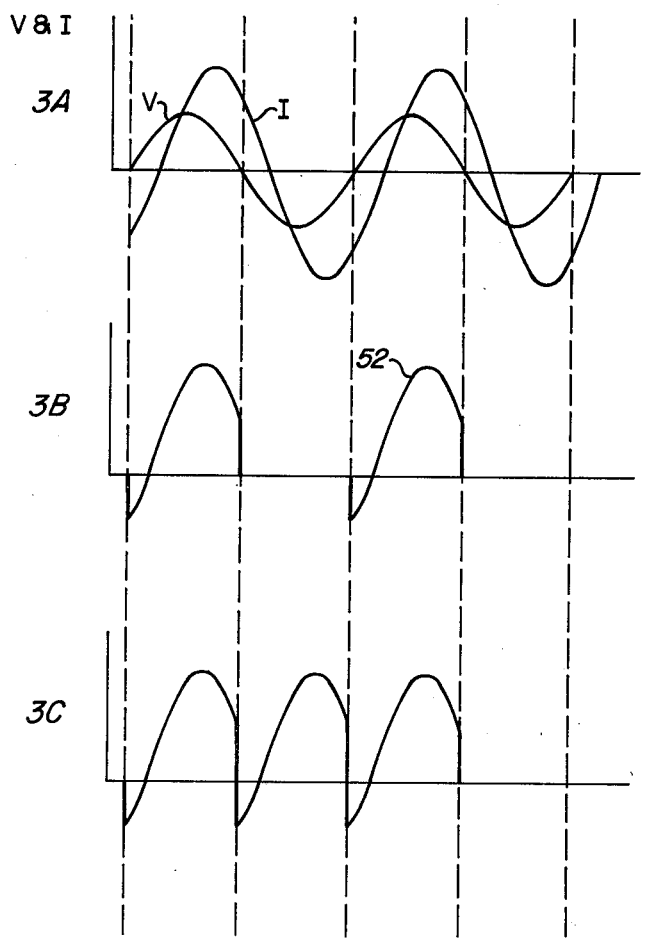

| | | | | |
|---|---|---|---|---|
| R1, R2 | 560Ω 1/2w | | C1, C2 | 100μf, 25V elect |
| R3 | 220K 1/2w | | C3 | 100μf, 6V elect |
| R4 | 33K 1/2w | | C4 | .01μf, 100V ceramic |
| R5 | 22K 1/2w | | C5 | 5μf, 6V elect |
| R6 | 1meg 1/2w | | C6 | .047μf, 500V ceramic |
| R7 | 220K 1/2w | | D1-D6 | lamp, 50 PIV min |
| R8, R9 | 100K 1/2w | | D7, D8 | 6.8V, 1watt zener |
| R10 | 4.7K 1/2w | | IC-1 | CD4016AE |
| R11 | 10K 1/2w | | IC-2, 3 | CA3094E |
| R12 | 180Ω 1w | | P1 | 10K, 20 turn |
| R13 | 47K 1/2w | | P2 | 1K, 1 turn |
| R14, R15 | 10K 1/2w | | TH1 | NTC thermister 400Ω @ 25°C |
| R16 | 470K 1/2w | | TR1 | 15amp, 400V TRIAC |
| R17 | 22K 1/2w | | T1 | 240V to 24VCT @ 80mA |
| R18 | 1.5K 1/2w | | | |
| R19 | 0.22Ω 10w | | | |

CIRCUIT FOR MONITORING THE MECHANICAL POWER FROM AN INDUCTION MOTOR AND FOR DETECTING EXCESSIVE HEAT EXCHANGER ICING

BACKGROUND OF THE INVENTION

This invention relates to a simple, electronic, detection circuit for detecting variations in the mechanical motor load of an induction motor and more particularly for detecting the extent to which the outdoor heat exchanger of a heat pump system is blocked by ice.

Heat pump systems for heating and cooling homes and other structures are becoming popular. Such heat pump systems ordinarily have an indoor heat exchanger, an outdoor heat exchanger and a compressor. In operation one heat exchanger functions as a part of the condensor and therefore provides a heat output and the other functions as part of the evaporator and therefore absorbs heat. Refrigerant is circulated through the closed loop. These functions are alternatively switched or interchanged between the indoor and the outdoor heat exchangers depending upon whether it is desired to cool or heat the indoors.

In the winter season, the outdoor heat exchanger operates as an evaporator for collecting heat from the atmosphere. In this mode of operation, the outdoor heat exchanger is cooled to temperatures substantially below the outdoor temperature. Consequently, under appropriate temperature and humidity conditions atmospheric water will condense on the outdoor heat exchanger and freeze.

Most outdoor heat exchangers are forced air systems having an induction motor connected to an impeller for effecting a flow of outdoor air across the heat exchanger. This air flow prevents the buildup of a thick thermal boundary layer and therefore improves the heat transfer from the outdoor air to the heat exchanger.

Unfortunately, over a period of time of from 20 minutes to several hours, the continuous accumulation of ice upon the outdoor heat exchanger not only provides an insulative thermal barrier which retards the heat flow between the exchanger and the outdoor air but also restricts and eventually entirely blocks the flow of air. Such ice blockage so significantly reduces the efficiency of the heat exchanger that the heat pump system must periodically be stopped and steps must be taken to remove the ice. This is ordinarily done by reversing the operation of the heat pump for a brief time interval so that the outdoor heat exchanger becomes a condenser and therefore is warmed by the compressed refrigerant.

A major problem with the heat pump system has been the detection of the excessively iced condition in order to initiate the de-icing procedures.

One prior art system for de-icing the outdoor heat exchanger uses a timer which, at selected time intervals and at selected times of the day, causes the heat pump to be reversed. This system, however, has caused problems because it is often operated when excessive icing has not occurred and under conditions of extreme icing may not permit enough time to remove all of the formed ice.

The timer system described above was improved by use of a temperature sensor which can effect the removal of all of the ice from the heat exchanger. When the exchanger rises to a temperature significantly above 32° F. the de-icing cycle is terminated. Such a temperature sensor, however, only serves to eliminate an excessively long de-icing cycle. It does not solve the problem of an inadequate de-icing interval.

Still another attempt to solve the problem of the prior art is the differential temperature control in which the temperature of the heat exchanger coil as well as the temperature of the outside ambient air is sensed. When the difference between these temperatures is more than a selected trigger level, the de-icing procedure is initiated. The magnitude of the trigger level is automatically varied in accordance with the outdoor temperature variations. However, the differential temperature control requires a different control circuit parameter for each heat exchanger unit because the temperature differentials and icing characteristics vary radically with small design variations in the heat exchanger.

Still another system for sensing the formation of ice on the heat exchanger is the air switch which detects the pressure differential between the air input side and the air exhaust side of the heat exchanger. Such a system initiates the de-ice procedures when the pressure differential exceeds a selected value. These air switches, however, suffer from the disadvantages that they are sensitive and respond to changes in wind velocity and are affected by any foreign matter that enters the sensing element.

Still a further attempt to detect the formation of ice was the temperature permissive, time initiated, temperature terminated, time override system. This system uses both a timer and a transducer which senses the temperature of the outside heat exchanger. Such a system, under control of the timer, automatically initiates the de-icing procedures unless the temperature sensor senses that the outdoor heat exchanger is too warm to have ice formation. Then, after a selected period de-icing is halted if the thermal sensor did not earlier terminate the de-icing function. However, this system can permit excessive icing to occur between successive time cycles. Conversely, the timer also permits initiation of defrost when the outdoor heat exchanger is cold enough, even though no icing may have occurred.

OBJECTS AND SUMMARY OF THE INVENTION

Accordingly, it is an object of the present invention to provide a simple, reliable, durable and inexpensive circuit for detecting the excessive icing of the heat exchanger of a heat pump system.

It is a further object of the present invention to provide a circuit for detecting a signal proportional to the mechanical output power from an induction motor in a manner which is not significantly effected by line voltage fluctuation, internal motor losses, atmospheric temperature or refrigerant charge.

A further object of the invention is to provide a de-icing sensor which is contained entirely within electronic circuitry connected to the power input circuit of an induction motor and therefore eliminates the need for external sensors or pickups which extend to other portions of the outdoor heat exchanger system.

A further object of the present invention is to provide a de-icing sensor which can be reset after de-icing is complete to return the system to normal operation by any of a variety of conventional reset devices.

A further object of the invention is to provide a de-ice control which can be adjustably calibrated to a desired proportion of complete heat exchanger blockage.

A still further object of the invention is to provide a de-ice control for heat pumps which eliminates other problems and disadvantages of prior art systems.

Further objects and features of the present invention will be apparent from the following specification and claims when considered in connection with the accompanying drawings illustrating the preferred embodiment of the invention.

In summary, the invention is a method and apparatus for generating an electrical signal proportional to the average product of induction motor current multiplied by the cosine of the phase angle between motor current and motor voltage. Such a circuit can provide a signal proportional to the mechanical power out from the induction motor and consequently can detect the degree or proportion of icing present on an outdoor heat exchanger of a heat pump system. The circuit includes means for full wave or half wave rectifying a signal which is an analog of motor current in phase with a motor voltage and then averaging the rectified signal.

DESCRIPTION OF THE DRAWINGS

FIG. 2 is a vector diagram and oscillograph illustrating voltage and current waveforms for a substantially unloaded induction motor and voltage and current are in quadrature.

FIG. 3 is a diagram view similar to that of FIG. 2 except that the induction motor is loaded and consequently the phase angle is less than 90°. FIG. 3B illustrates half wave, voltage phased rectification and FIG. 3C illustrates full wave, voltage phased rectification.

Figure 1:
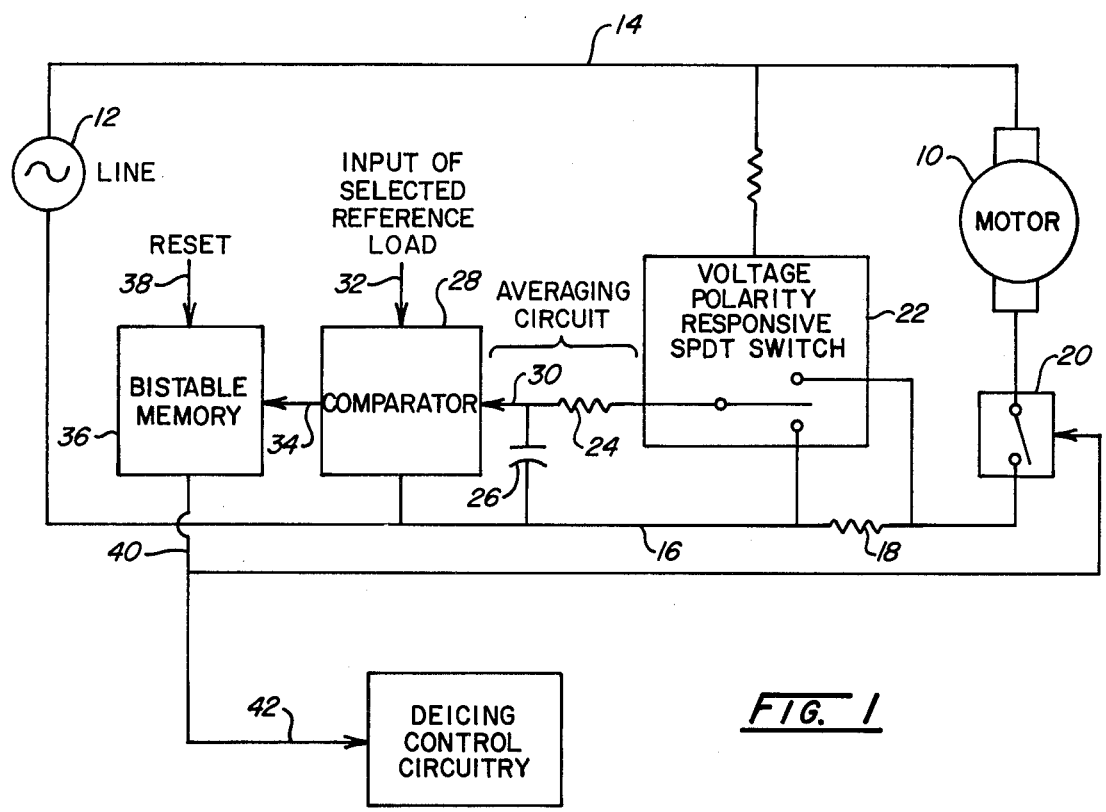
FIGS. 1 and 1A are a simplified block diagrams illustrating the preferred embodiment of the invention.

It is to be understood that while the detailed drawings and specific examples given describe preferred embodiments of the invention, they are for the purposes of illustration only, that the apparatus of the invention is not limited to the precise details and conditions disclosed and that various changes may be made therein without departing from the spirit of the invention which is defined by the following claims.

DETAILED DESCRIPTION

The blockage of the air flow through a heat exchanger not only substantially reduces the quantity of air flow through the exchanger but additionally causes a variation in the mechanical power delivered by the induction motor which drives the air impeller. The most predominate commercial equipment has a motor driven fan or propeller type impeller. Icing and blockage of the heat exchanger of such a system causes a back pressure which increases the mechanical motor output power. Typically, the power increase in going from no blockage to complete icing and blockage is reflected as a 30% to 70% increase in mechanical power delivery.

In a system which utilizes a centrifugal impeller, such as a squirrel cage, blockage similarly reduces the mechanical power output from the induction motor.

In a conventionally designed outdoor heat exchanger system, a nearly linear relationship exists between the proportion of blockage and the variation in mechanical loading. Consequently, it is the purpose of the present invention to detect such changes in mechanical loading and to initiate a de-icing or defrosting cycle. The present invention is able to detect the occurrence of motor output mechanical power exceeding preset limits although the circuit is connected solely in the electrical power supply circuit of the induction motor.

Circuits for detecting the electrical power input to an induction motor have been available for decades. In circumstances where a rough approximation of mechanical output power is adequate, it is often assumed that electrical input power is approximately equal to mechanical output power. However, in a heat exchanger system, as in some other systems utilizing induction motors, such an approximation is not adequate.

Relative variations in mechanical output power may be more important. Under normal operating conditions, a substantial amount of mechanical power must be delivered by the induction motor to the impeller in the heat exchanger system. The blockage of the heat exchanger causes variations in the delivered mechanical power which are sensed for determining the icing condition.

A conventional electrical power transducer is sensitive to variations in line voltage. Such line fluctuations primarily merely cause increased heat loss within the motor. If an electrical power transducer were used to detect increased mechanical loading, line fluctuations would be erroneously interpreted by such a detector as increased mechanical motor loading.

Furthermore, because it is desirable to make the icing detection system insensitive to voltage fluctuations, the detection circuit cannot be a voltage transducer since it too would respond to such voltage fluctuations. A current transducer would not be effective because current changes vary little as the delivered motor power varies from no load to full load. For example, the current of an induction motor may vary within the range of 2.5 to 3.25 amps for a typical induction motor.

The present invention detects an electrical signal which is proportional to $I\cos\theta$. This signal is very nearly directly proportional to mechanical motor loading and is not effected by power line voltage fluctuations.

Therefore, in the present invention an electronic signal may be generated which is substantially proportional to the mechanical power delivered by an induction motor by detecting an electronic signal which is proportional to the average product of motor current multiplied by the cosine of the phase angle between motor current and motor voltage.

The electronic signal which is proportional to $I\cos\theta$ is developed by using a switch to gate a signal proportional to motor current in a manner to rectify it in phase with the motor voltage and then averaging the gated signal. Therefore the current is rectified in phase with the voltage rather than in phase with itself as is conventionally done in simple power rectifier circuits.

The gated signal may be a voltage which is dropped across a small resistance in series with the motor. That voltage provides an analog of the motor current. It is rectified in phase with the motor voltage and is then applied to an averaging circuit. The present invention contemplates both half wave and full wave rectification as illustrated in FIG. 3 and described below.

This average of the voltage phase rectified signal, which is proportional to motor mechanical power output, may be used to detect a motor overload or underload to preselected limits by continuously comparing the average gated signal to a reference signal. The current flow to the motor may then be interrupted when the average gated signal becomes substantially equal to the reference signal. Additionally, the same may be used to initiate the de-icing cycle for the heat pump system.

FIG. 1 illustrates an induction motor 10 which is supplied with power from a source 12, such as a 240 volt AC supply, through conductors 14 and 16. A series resistance 18 and a switch 20 are connected in series with the motor 10 and the line source 12. The series resistance 18 is small, such as 0.22 ohms, which, in the well known manner, can drop a voltage which is relatively small relative to the line voltage but will be directly proportional to the current of the motor 10.

The voltage across series resistance 18 is rectified by gating it in phase with the voltage across the motor 10 which is substantially the voltage from line 14 to line 16. It is gated by means of a single pole double throw switch 22 which is controlled by the voltage across the motor 10.

Alternative systems can be used for generating a signal which is proportional to motor current. For example, a transformer, Hall effect device or magnetically coupled device could each be adapted for use with the present invention.

The output from the switch 22 is the voltage phase rectified current signal and is applied to a simple RC integrator having resistance 24 and capacitance 26 for time averaging the switched signal and applying it to a comparator circuit 28. The signal from the output 30 of the averaging circuit appears across the capacitors 26 and could be used for a feedback control system, applied to a meter for indicating and metering the relative level of mechanical loading or applied to an overload or underload alarm circuit.

In the preferred embodiment, the averaged output signal is applied to the input 30 of the comparator 28 and is proportional to the mechanical power out from the motor 10.

The comparator 28 also has a reference input 32 which is adjusted to determine an excursion or departure limit for the averaged signal which is applied at the comparator input 30. The comparator 28 operates to switch the state of its output 34 when the averaged signal at the input 30 makes a crossover with the reference signal at the input 32. The output 34 of the comparator 28 may be connected to the de-icing means for initiating the de-icing of the heat exchanger in response to its change of state.

Preferably, however, it is applied to a memory such as a bi-stable flip-flop 36 which has a reset input 38. The bi-stable flip-flop 36 has an output 40 which switches to a first state when the averaged input to the comparator at input 30 reaches the load limit determined by the reference input 32 to the comparator 28. The output 40 is connected to de-icing control circuitry 42 to initiate the de-icing cycle. Additionally, the output of the bi-stable flip-flop 36 is also connected to the motor control switch 20 to open the switch 20 when the motor lead reaches the limit.

The bi-stable memory means 36 will remain in its second state until signal is applied to its reset input 38. Upon such a reset input, the bi-stable flip-flop 36 switches its state to halt the de-icing control circuit 42 and stop the de-icing cycle and to again close the switch 20 and reactuate the motor 10.

Figure 1A:
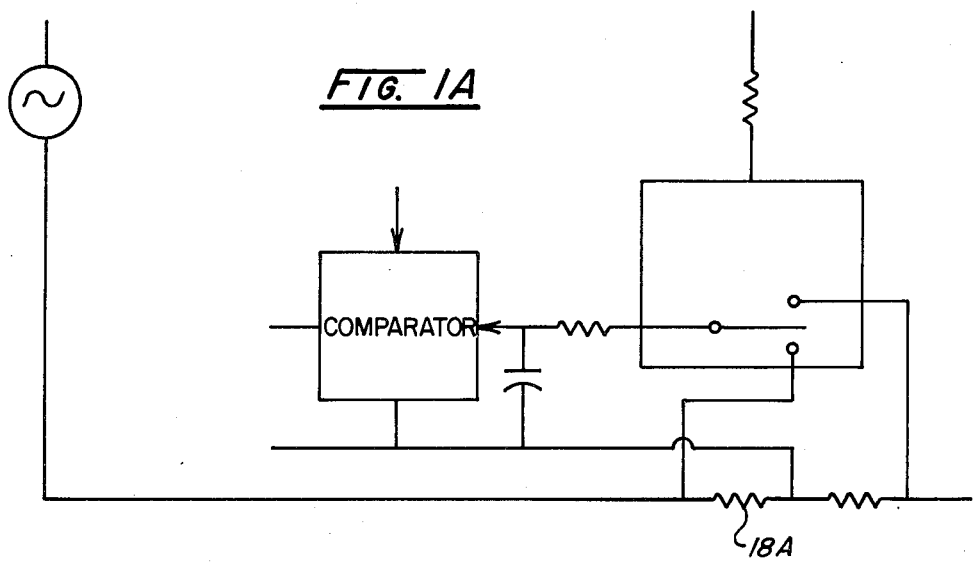

As illustrated in FIGS. 2 and 3, the gating switch 22 is phase responsive so that the switch will be in a first position during positive half cycles of the voltage waveform and in its other position during the negative half cycles. It is contemplated, however, within the present invention that a gating switch 22 may be used for full wave, voltage phase rectification. For example, FIG. 1A illustrates an alternative modification in the circuit of FIG. 1 which will give the full wave, voltage phase rectification. Essentially, the current sensing resistance 18 is changed to a center tapped resistance 18A, the center of which becomes the common for the averaging circuit, the comparator and subsequently cascaded circuitry.

FIG. 2 illustrates the voltages and current associated with an embodiment of the present invention under ideal conditions of no mechanical motor loading. Under these conditions the motor current will lag the motor voltage by approximately 90° and consequently the rectified current signal 50 will have an average value of approximately zero.

However, as illustrated in FIG. 3 under a substantial load the motor current will lag the motor voltage by less than 90° and the gated signal 52 will have a non-zero average value. It is the changes in the average value of the signal 52 which are to be detected by the comparator 28. These changes determine whether the mechanical power output has departed from its value for an unblocked heat exchanger to a preselected limit which indicates that the heat exchanger is sufficiently blocked with ice that the de-icing operation should be initiated.

Of course, as motor loading increases, the phase angle will decrease. As this occurs the signal 52 will tend to approach that of a conventional half wave rectified sine wave which is rectified in phase with itself. The conventional rectified wave will provide the theoretical maximum averaged value.

FIG. 3B illustrates the current related signal which is rectified in phase with the voltage in the half wave mode of the circuit of FIG. 1. FIG. 3C illustrates the current related signal which is full wave rectified in phase with the voltage.

The average value of the signal of FIG. 3B may be expressed as $$\frac{\sqrt{2}\,I}{2\pi} \quad \pi \int_{-\theta}^{-\theta} \sin\omega t\, d(\omega t)$$

where:

I is the rms amplitude of the current related signal and
$\theta$ is the phase angle between motor voltage and motor current.

When the above integral is integrated over the limits shown it reduces to $$0.45 I \cos\theta$$

For full wave, voltage phase rectification the above two expressions are multiplied by a factor of 2.

Figure 4:
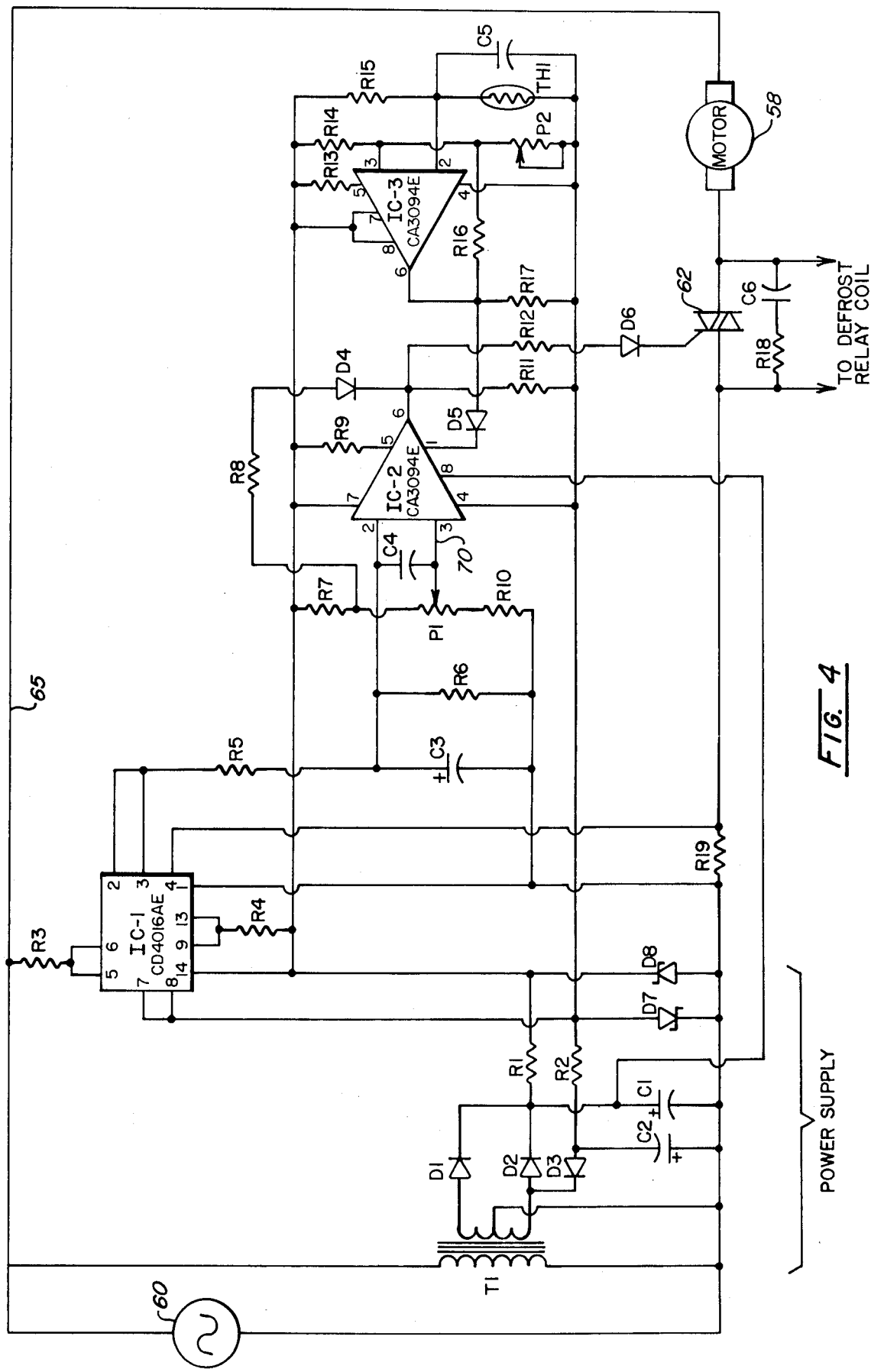
FIG. 4 is a detailed schematic diagram of the preferred embodiment of the invention.

FIG. 4 illustrates the preferred embodiment of the invention in which electrical energy is supplied to a motor 58 from the power line source 60 through the series connected current sensing resistance R19 and a gated, bidirectional switch or triac 62. The power supply for the integrated circuits IC1, IC2 and IC3 is provided by power transformer T1 connected to rectifying diodes D1, D2 and D3 and a filter consisting of resistors R1 and R2 and capacitances C1 and C2. This power supply is regulated to ±7 volts by zener diodes D7 and D8.

A voltage of approximately 500 millivolts rms is developed across the current sensing resistance R19 and is applied to pins 1 and 4 of integrated circuit IC-1. Integrated circuit IC-1 is an off-the-shelf unit which provides four single pole, single throw switches. It is connected in the circuit of FIG. 4 to form the single pole double throw switch such as illustrated in FIG. 1. Pins 2 and 3 are connected together to provide the wiper connection for the single pole double throw switch. The other terminals of the switch are pin 1 which is connected to the system ground and pin 4 which is connected to the opposite side of current sensing resistance R19. Power is supplied to the integrated circuit through pins 7, 8, 9, 13 and 14.

Pins 5 and 6 are connected together and through resistance R3 to the conductor 66 connected to one side of the motor 58 to provide the switch control input. Integrated circuit IC-1 is switched to one state when the voltage at the control input pins 5 and 6 is positive with respect to the system ground at its pin 1 and is thrown to its other state when this voltage is negative.

The gated current signal output from integrated circuit IC-1 appears at pins 2 and 3 and is applied to the time averaging circuit comprising resistances R5 and R6 and the capacitance C3.

Figures 5, 6:
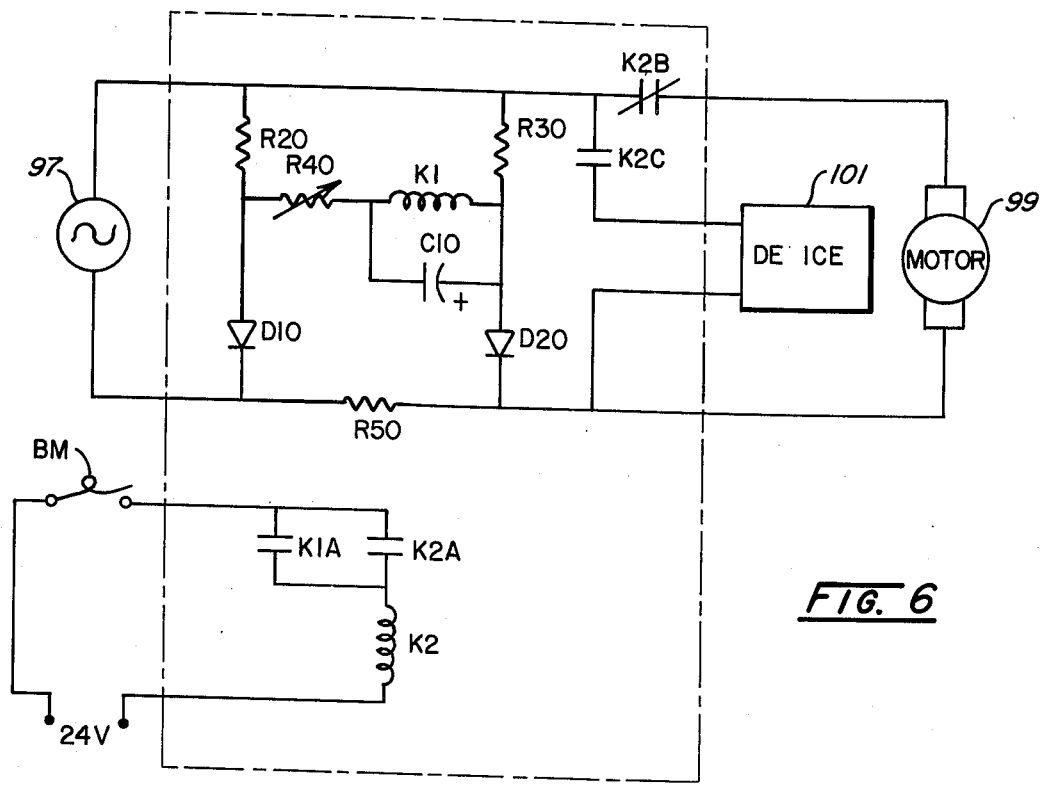
FIG. 5 is a table of circuit element values.
FIG. 6 is a schematic diagram of an alternative embodiment of the invention.

It will be apparent from the accompanying table of circuit element values shown in FIG. 5 that the time constant for the averaging circuit is approximately 10 seconds. This not only prevents the response of the circuitry to electrical transients or the physical transients such as a gust of wind, but additionally provides an adequate time delay upon the beginning of motor operation for the motor to bring the fan up to operating speed.

Integrated circuit IC-2 is a comparator. The averaged, current-dependent signal which is developed across capacitance C3 is applied to one input of integrated circuit IC-2. This input signal is applied to pin 2 and is the $I\cos\theta$ signal.

Resistances R10 and R7 together with the potentiometer P1 are connected in series to form an adjustable voltage divider which is stable and relatively drift free. It applies a reference potential from the wiper 70 of potentiometer P1 to the other input at pin 3 of the comparator IC-2. The input of damaging transients is prevented by capacitance C4. The power supply is connected to integrated circuit IC-2 through pins 5, 7, 4 and 8.

The output of the comparator IC-2 is connected through resistance R12 and diode D6 to the gate of the bilateral switch 62 for opening and closing the bilateral switch 62 and thereby controlling the current through the motor 58.

A potential for use in controlling the circuitry which initiates and controls the defrost or de-ice cycle is conveniently available across the bilateral switch 62. It is available because, when the switch 62 is closed, the voltage across the bilateral switch 62 is substantially zero, but when the switch 62 is open, and consequently in a very high impedance state, the voltage developed across the bilateral switch 62 from current leakage through the motor 58 and resistance R19 will nearly equal the voltage of power source 60. This voltage may conveniently be used with transient suppression filter elements R18 and C6 to control a relay coil which in turn controls the operation of the de-ice mechanism.

Integrated circuit IC-3 is also a comparator and provides a reset circuit. The reset circuit of IC-3 together with the integrated circuit IC-2 simultaneously also function as a bi-stable memory means.

An input is provided to pin 2 of integrated circuit IC-3 for signalling the occurrence of conditions for terminating the de-icing cycle and resuming the normal operation of the heat pump. A variety of transducers can be used for signalling when the de-ice cycle should be terminated. While this could be done by the use of timing mechanisms, bimetallic temperatures switches or a separate manually actuated switch, the preferred detector is a thermistor TH-1 thermally connected to the heat exchanger and electrically connected in series to a resistance R15 to form a voltage divider having its intermediate potential applied to pin 2 of integrated circuit IC-3. Since variations of the temperature of the thermister TH-1 cause variations in its resistance, the potential applied at pin 2 of IC-3 will correspond to the temperature of the heat exchanger.

The resistance R14 and the potentiometer P2 are also series connected to form a voltage divider which is adjustable to provide an effective temperature reference signal to pin 3 of the integrated circuit IC-3. The power is applied to IC-3 through terminals 4, 5, 7 and 8.

In order to provide for the desired bi-stable memory operation and in order to permit the reset circuitry of integrated circuit IC-3 to reset the state of integrated circuit IC-2, a feedback resistance R16 connects the output of pin 6 of IC-3 to its input terminal 3, a series resistance R8 and diode D4 connect the output pin 6 of IC-2 to its input pin 2 and a diode D5 connects the output pin 6 of IC-3 to pin 1 of IC-2.

The operation of the circuit illustrated in FIG. 4 may begin with the presumption that the motor 58 is operating to drive the air impeller of the outdoor heat exchanger. As ice accumulates on the heat exchanger the mechanical output of the induction motor 58 is varied. The average value of the gated, current-related signal developed across R19 is applied to pin 2 of IC-2.

The averaging circuit is alternately switched between the current signal and ground to periodically discharge the capacitance C3 so that the output of the averaging circuit will represent the average value of the gated waveform rather than its cummulative time integral.

The gated average signal will begin increasing positively until it crosses over the value of the reference potential applied at pin 3 of IC-2. This reference potential is experimentally determined for the particular motor and mechanical characteristics of each particular outdoor heat exchanger.

Upon crossover, the output of comparator IC-2 will switch from a positive state to a negative state thus opening bi-lateral switch 62 and preventing current flow to motor 58.

Upon the transition of the output pin 6 of comparator IC-2 to a very negative saturation state, the output voltage operates through diode D4 and resistance R8 to pull the potential applied to pin 3 very negative thereby latching the comparator IC-2 in that state.

The opening of bi-lateral switch 62 initiates the de-ice cycle. As de-icing and defrosting is completed the thermistor R5 will begin warming and decreasing in resistance. When the potential at pin 2 crosses over the reference potential applied to pin 3, the output of integrated circuit IC-3 switches from a negative saturation state to a positive saturation state so that through D5 diode this positive level will be applied to integrated circuit IC-2 and drive its output at pin 6 to a positive potential. This in turn brings the triac TR-1 62 into conduction and returns the circuit to normal operation.

The alternative circuit of FIG. 6 develops the Icosθ signal across the series connected R4 and K1. During the positive half cycle of the source 97 voltage, diodes D10 and D20 will conduct. Since their voltage drop is essentially zero and substantially equal, the current related voltage which is dropped across the current sensing resistance R50 will appear across the series connected branch of R40 and relay K1 is like that illustrated in FIG. 3B.

The signal is averaged by the response time of the relay K1 and the energy storage of the relay coil K1 and the shunt capacitance C10. These elements can not respond within the period of the conventional power line source but rather will respond to its average over a substantially longer time interval.

The comparison function for detecting the limit at which an overload is detected is performed by the drop-in current of the relay K1 and the adjustable resistance R40. When the average current through relay coil K1 reaches its drop in current, contacts K1A close to energize relay coil K2. This closes contacts K2A to latch K2, opens contacts K2B to stop current flow to the motor 99 and closes contacts K2C which are connected to activate the de-ice control circuitry 101 of a heat pump system. This begins the de-ice cycle.

The bimetallic temperature sensor switch BM which is mounted to sense outdoor heat exchanger temperature, will become sufficiently warm to open its contacts after de-icing is completed. Thereupon relay K2 will deenergize to resume the supply of power to the motor 99.

It is to be understood that while the detailed drawings and specific examples given describe preferred embodiments of the invention, they are for the purposes of illustration only, that the apparatus of the invention is not limited to the precise details and conditions disclosed and that various changes may be made therein without departing from the spirit of the invention which is defined by the following claims.

We claim:

1. A method for generating an electrical signal which is substantially proportional to the mechanical power delivered by an induction motor, the method comprising detecting an electronic signal proportional to the average product of motor current multiplied by the cosine of the phase angle between motor current and the motor voltage.

2. A method for generating an electrical signal which is substantially proportional to the mechanical power delivered by an induction motor, the method comprising rectifying a signal which is an analog of said motor current in phase with said motor voltage and averaging said rectified signal.

3. A method according to claim 2 further comprising the steps of continuously comparing said average of the rectified signal to a reference signal and interrupting the current flow to said motor when said average rectified signal becomes substantially equal to said reference signal.

4. A method for detecting the iced condition of the forced air heat exchanger of a heat pump system including an induction motor driven air impeller for effecting the flow of air across said heat exchanger and for stopping said motor upon detection of excess icing, the method comprising:

(a) detecting a signal proportional to the average product of the current of said motor multiplied by the cosine of the phase angle between said current and the voltage across said motor;

(b) comparing said average product signal to a reference signal; and (c) interrupting the current flow to said motor when said average product signal becomes substantially equal to said reference signal.

5. A method according to claim 4 wherein said detecting more particularly comprises rectifying a signal which is an analog of said motor current in phase with said motor voltage and averaging said rectified signal.

6. An apparatus for providing an electrical signal which is proportional to the mechanical output power of an induction motor, said apparatus comprising:

(a) current detecting means connected in the power supply circuit of said motor for providing a signal proportional to motor current;

(b) switching means connected to the output of said current detecting means and to said motor for rectifying the signal from said output in phase with the voltage applied to said motor; and (c) integrating circuit means connected to said switch means for time averaging said rectified signal to provide said proportional signal.

7. An apparatus according to claim 6 wherein said current signal is half wave rectified in phase with said voltage.

8. An apparatus according to claim 6 wherein said current signal is full wave rectified in phase with said voltage.

9. An apparatus for detecting the excessive icing of the outdoor heat exchanger of a heat pump system including an induction motor driven impeller for effecting the flow of air across said heat exchanger and for initiating the de-icing of said heat exchanger, said apparatus comprising:

(a) current detecting means connected in the power supply circuit of said motor for providing a signal proportional to motor current;

(b) switching means connected to the output of said current detecting means and to said motor for rectifying the signal from said output in phase with the voltage applied to said motor; and (c) integrating circuit means connected to said switching means for time averaging said switched signal to provide said proportional signal;

(d) comparator circuit means having a reference input and an input connected to the output of said integrating circuit for switching its output state when said averaged signal becomes substantially equal to said reference signal; and (e) de-icing means connected to the output of said comparator for de-icing said heat exchanger in response to said change of state.

10. An apparatus according to claim 9 further comprising: a bi-stable memory means interposed between said comparator and said de-icing means and having an input connected to a reset means for being switched to a first state and initiating said de-icing means in response to said averaged signal becoming substantially equal to said reference signal and for thereafter remaining in its first state until actuation of said reset means, said reset means switching said bi-stable memory means to a second state for halting said de-icing means.

* * * * *

UNITED STATES PATENT OFFICE
CERTIFICATE OF CORRECTION

Patent No. 4,123,792  Dated October 31, 1978

Inventor(s) Don A. Gephart and Bruce H. Weber

It is certified that error appears in the above-identified patent and that said Letters Patent are hereby corrected as shown below:

At Column 6, line 45, the mathematical expression should be shown as:

$$\frac{\sqrt{2} \, I}{2 \pi} \int_{-\Theta}^{\pi - \Theta} \sin \omega t \, d(\omega t)$$

Signed and Sealed this

Thirteenth Day of February 1979

[SEAL]

Attest:

RUTH C. MASON
Attesting Officer

DONALD W. BANNER
Commissioner of Patents and Trademarks